United States Patent
Hu et al.

(10) Patent No.: US 7,639,502 B2
(45) Date of Patent: Dec. 29, 2009

(54) FASTENING ELEMENT FOR HEAT DISSIPATING APPARATUS

(75) Inventors: Che-Cheng Hu, Taipei Hsien (TW); Chih-Hao Yang, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 258 days.

(21) Appl. No.: 11/614,698

(22) Filed: Dec. 21, 2006

(65) Prior Publication Data
US 2008/0055858 A1  Mar. 6, 2008

(30) Foreign Application Priority Data
Sep. 1, 2006  (CN) .......................... 2006 1 0062435

(51) Int. Cl.
*H05K 7/20*  (2006.01)

(52) U.S. Cl. ................... 361/710; 361/704; 361/709

(58) Field of Classification Search .............. 361/704, 361/707, 709, 710, 695, 697
See application file for complete search history.

(56) References Cited

U.S. PATENT DOCUMENTS

| 5,730,210 | A  | * | 3/1998  | Kou .......................... 165/80.3 |
| 5,771,153 | A  |   | 6/1998  | Sheng |
| 5,901,039 | A  |   | 5/1999  | Dehaine et al. |
| 5,947,191 | A  | * | 9/1999  | Hiteshew et al. ........... 165/80.3 |
| 6,307,748 | B1 | * | 10/2001 | Lin et al. .................. 361/704 |
| 6,392,889 | B1 | * | 5/2002  | Lee et al. .................. 361/704 |
| 6,412,546 | B1 | * | 7/2002  | Lin et al. .................. 165/80.3 |
| 6,475,030 | B1 | * | 11/2002 | Chang ....................... 439/557 |
| 6,480,387 | B1 | * | 11/2002 | Lee et al. .................. 361/704 |
| 6,498,724 | B1 | * | 12/2002 | Chien ....................... 361/687 |
| 6,501,658 | B2 | * | 12/2002 | Pearson et al. ............. 361/709 |
| 6,697,256 | B1 | * | 2/2004  | Horng et al. ............... 361/704 |
| 6,752,577 | B2 | * | 6/2004  | Chen et al. ................. 411/508 |
| 6,795,317 | B1 | * | 9/2004  | Liu ......................... 361/704 |
| 6,871,702 | B2 | * | 3/2005  | Horng et al. ........... 165/104.33 |
| 7,099,156 | B2 | * | 8/2006  | Chen et al. ................. 361/719 |
| 7,126,823 | B2 | * | 10/2006 | Chen et al. ................. 361/702 |
| 7,164,583 | B2 | * | 1/2007  | Lee et al. .................. 361/704 |
| 7,359,200 | B2 | * | 4/2008  | Zhou et al. ................. 361/704 |
| 2005/0111192 | A1 | * | 5/2005 | Lee et al. .................. 361/704 |
| 2005/0141201 | A1 | * | 6/2005 | Chen et al. ................. 361/704 |

FOREIGN PATENT DOCUMENTS

| CN | 2682580 | 3/2005 |
| CN | 2727956 | 9/2005 |

* cited by examiner

*Primary Examiner*—Jayprakash N Gandhi
*Assistant Examiner*—Adrian S Wilson
(74) *Attorney, Agent, or Firm*—Frank R. Niranjan

(57) ABSTRACT

A heat dissipating apparatus (100) includes a heat sink (20) and a plurality of fastening elements (10). The heat sink includes a base (22) and a plurality of fins (24). The fastening element includes a head (12), a resilient member (14) and a connecting member (16). The connecting member includes two blocks (166). The base of the heat sink defines a plurality of through holes (222b) therein for extension of the connecting members of the fastening elements, wherein two opposite cutouts (222c) are defined in the base and communicating with each of the through holes. After the connecting member and the two blocks are downward extended through the through hole and the cutouts, respectively, the connecting member is rotated a degree so that the blocks securely abut against a bottom surface of the base.

10 Claims, 10 Drawing Sheets

FASTENING ELEMENT FOR HEAT DISSIPATING APPARATUS

BACKGROUND OF THE INVENTION

1. Field of the Invention

The present invention relates generally to a heat dissipating apparatus, and more particularly to a fastening element for the heat dissipating apparatus.

2. Description of Related Art

A heat dissipating apparatus always includes a thermal module for dissipating heat generated by an electronic component mounted on a printed circuit board, and a plurality of mounting elements for mounting the thermal module onto the printed circuit board so that the thermal module can have an intimate contact with the electronic component.

Each of the mounting elements usually includes a bolt defining an annular groove at a middle portion thereof, a coil spring disposed around the bolt, a C-shaped lamellar fastener capable of being snapped in the groove, and a screw nut threadedly engaging with a screwed end portion of the bolt.

The fasteners are made of metal with good resiliency. Each of the fasteners radially defines a through slit. In assembly of the heat dissipating apparatus, the fasteners are expanded radially outwardly by a fixture to surround grooves of the bolts; then the expanding force exerted on the fasteners by the fixture is released so that the fasteners snap in the grooves of the bolts, thereby pre-assembling the bolts to the thermal module. The bolts are then screwed with the screw nuts respectively to mount the pre-assembled thermal module to the circuit board.

In this heat dissipating apparatus, the configuration of the fastener is lamellar, which results in that the fastener does not have adequate strength to resist an external force possibly acting thereon. Therefore, the fasteners may be torn by the unexpected external force exerted thereon, which will cause the fasteners to separate from the bolts during transportation/handling of the pre-assembled thermal module. Without the fasteners snapped in the grooves, the bolts could separate from thermal module, which increases inconveniency and trouble in assembling the thermal module to the printed circuit board. Furthermore, if the fasteners are separated from the bolts after the thermal module is mounted to the printed circuit board, the fasteners fall on the printed circuit board. Such fasteners can cause short circuit of the printed circuit board, which could, in turn, incur a malfunction of a computer or damages of components of the computer.

SUMMARY OF THE INVENTION

The present invention relates to a heat dissipating apparatus, and more particularly to a fastening element for the heat dissipating apparatus. According to a preferred embodiment of the present invention, the heat dissipating apparatus includes a heat sink and a plurality of fastening elements. The heat sink includes a base and a plurality of fins disposed at one side of the base. The fastening element includes a head, a resilient member and a connecting member. The connecting member includes two blocks at a bottom thereof. The base of the heat sink defines a plurality of through holes therein for extension of the connecting members of the fastening elements, respectively. Two cutouts are defined in opposite sides of each through hole for extension of the blocks. A portion of the connecting member and the blocks respectively extend through the through hole and the cutouts and are rotated to a certain position wherein the blocks abut against a bottom surface of the base of the heat sink so as to secure the connecting member together with the head and the resilient member to the heat sink.

Other advantages and novel features of the present invention will become more apparent from the following detailed description of preferred embodiment when taken in conjunction with the accompanying drawings, in which:

DETAILED DESCRIPTION OF THE INVENTION

Figure 1:
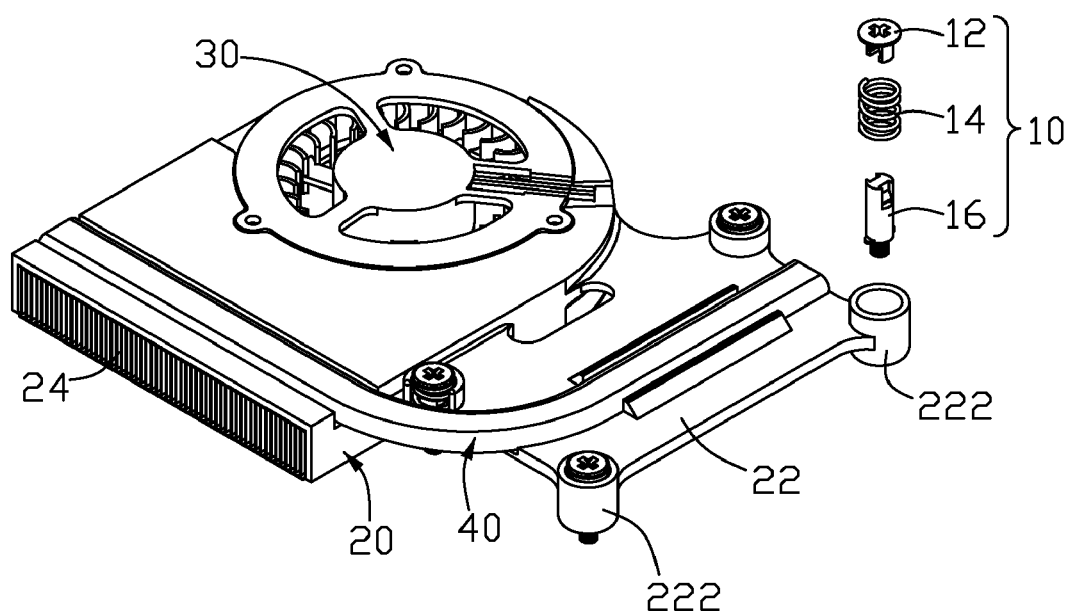
FIG. 1 is an isometric view of a heat dissipating apparatus according to a preferred embodiment of the present invention.

Referring to FIG. 1, a heat dissipating apparatus 100 according to a preferred embodiment of the present invention includes a heat sink 20 for dissipating heat generated by a heat generating electronic component (not shown) mounted on a circuit board (not shown), a heat dissipating fan 30 for providing an airflow flowing through the heat sink 20, a heat pipe 40 thermally connecting the heat generating electronic component with the heat sink 20 for transferring heat therebetween, and a plurality of fastening elements 10 for mounting the heat sink 20 onto the circuit board.

The heat sink 20 includes a metal base 22 and a plurality of fins 24 disposed on one side of the base 22. The heat dissipating fan 30 is a centrifugal blower which is mounted on the same side of the base 22. The fins 24 of the heat sink 20 are arranged at an air outlet of the fan 30. The base 22 includes four sleeves 222 disposed at four corners thereof for extension of the fastening elements 10.

Figure 2:
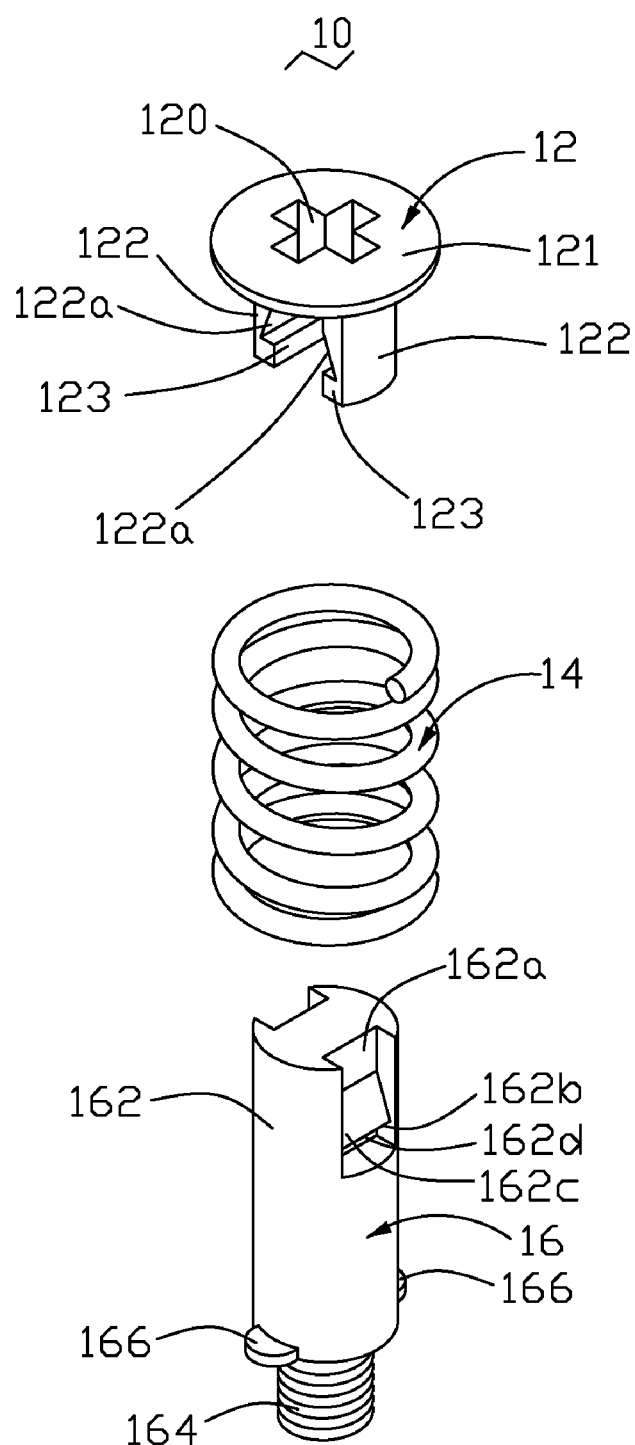
FIG. 2 is an exploded, isometric view of a fastening element of the heat dissipating apparatus of FIG. 1.

Particularly referring to FIG. 2, each of the fastening elements 10 includes a head 12, a resilient member 14 and a cylindrical connecting member 16. The head 12 of the fastening element 10 includes a round cap 121 and two spaced legs 122 extending downwardly from a bottom surface of the cap 121. An inner side of each of the legs 122 defines a recess (not labeled) therein so as to form a hook 123 at a free end of the leg 122 and a first slantwise surface 122a above the hook 123. The resilient member 14 is a coil spring in this embodiment, which surrounds the connecting member 16. Alternatively, the resilient member 14 may be a metal-plate spring instead of the coil spring. The connecting member 16 includes a main portion 162, a fixing portion such as a threaded end 164 extending downwardly from a bottom end of the main portion 162, and two opposite blocks 166 radially extending outwardly from the bottom end of the main portion 162. The blocks 166 have similar length. A diameter of the threaded end 164 is smaller than a diameter of the main portion 162. A top end of the connecting member 16 defines two parallel grooves 162a therein, and includes two bulges 162b extending from middle portions of the grooves 162a. An indent 162d is defined in the connecting member 16 below each of the bulges 162b. The bulges 162b each has a second slantwise surface 162c corresponding to the first slantwise surface 122 of the head 12 for guiding the hooks 123 to slip into the indents 162d.

Figure 3:
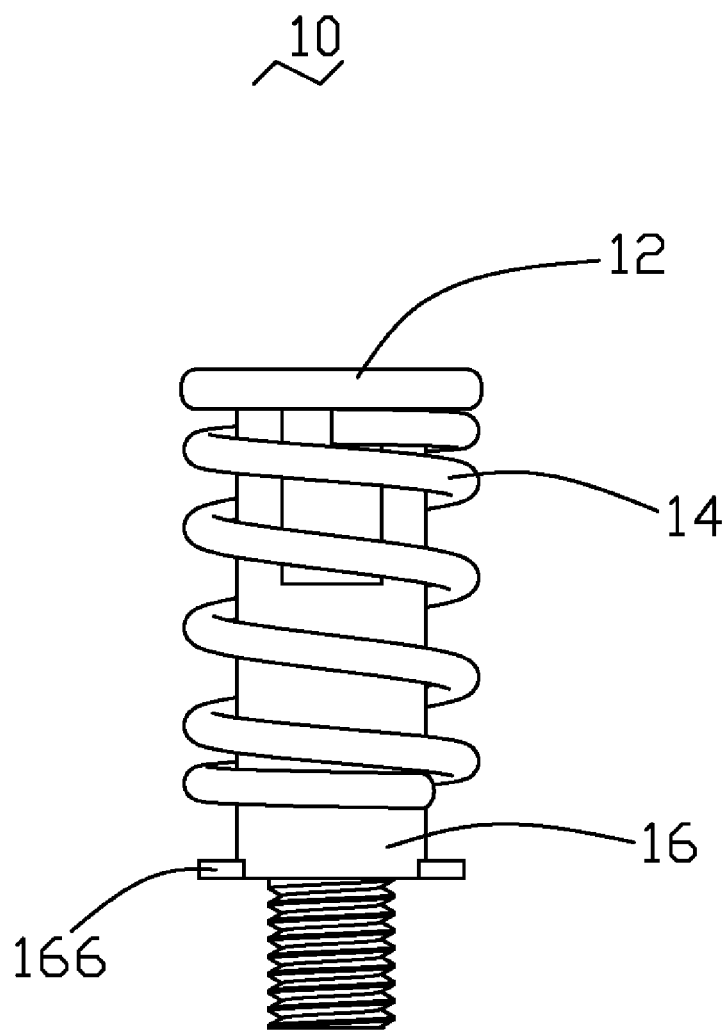
FIG. 3 is an assembled view of the fastening element of FIG. 2.

Referring to FIG. 3, in assembly of the fastening elements 10, the resilient members 14 are disposed around the main portions 162 of the connecting members 16, respectively. The heads 12 of the fastening elements 10 are positioned on the connecting members 16, respectively, with the hooks 123 of the heads 12 being received in the grooves 162a of the connecting members 16. The heads 12 of the fastening elements 10 are pressed downwardly towards the connecting members 16. Meanwhile, the hooks 123 are guided towards the indents 162d via the second slantwise surfaces 162c and finally received in the indents 162d and engaged with the bulges 162b of the connecting members 16. The resilient members 14 are therefore sandwiched between the blocks 166 of the connecting members 16 and the caps 121 of the heads 12. A distance between outer ends of the blocks 166 is greater than a diameter of an inner side of the resilient member 14 so as to prevent the resilient members 14 from falling off from the connecting members 16. Thus, the fastening elements 10 are assembled. Particularly referring to FIG. 2, the cap 121 of the head 12 further defines a crossed groove 120 therein so that four fixtures (not shown) can be received in the crossed grooves 120 to rotate the connecting members 16 together with the blocks 166 of the fastening elements 10 to leave cutouts 222c of the sleeves 222 so that the fastening elements 10 are secured to the heat sink 20. Regarding this, a detailed illustration will be given herebelow.

Figure 4:
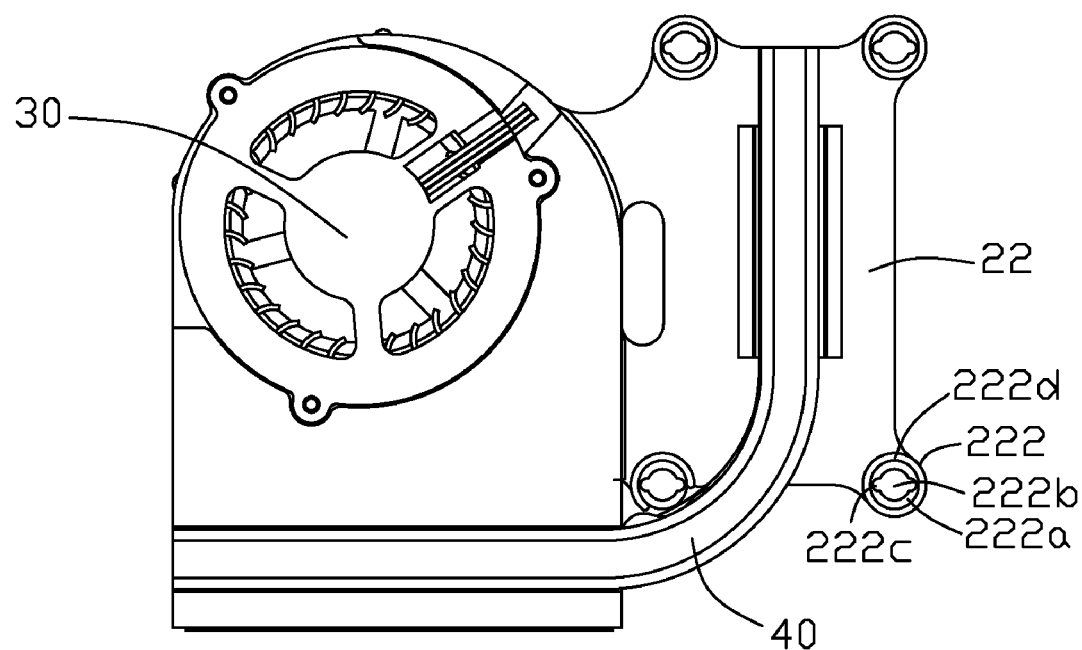
FIG. 4 is a top view of the heat dissipating apparatus with the fastening elements being removed.
Figure 5:
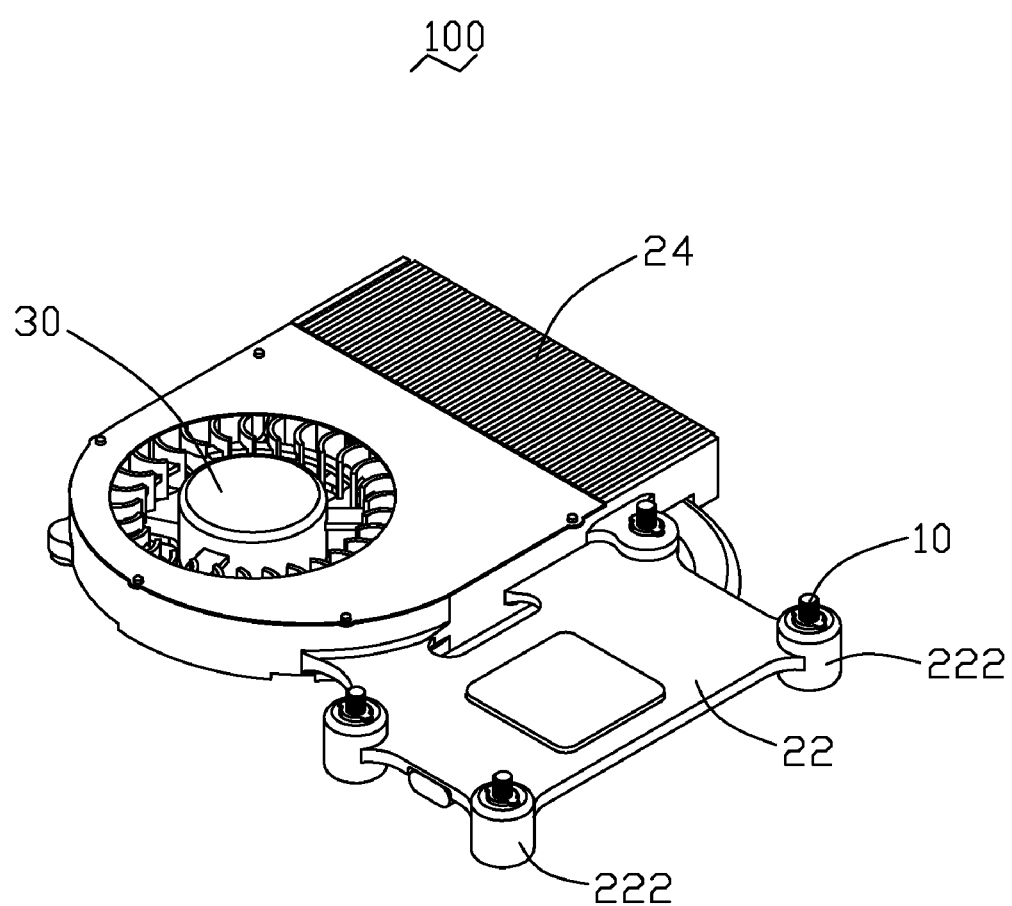
FIG. 5 is an isometric view of the heat dissipating apparatus, viewed from a bottom aspect, showing the fastening elements being disposed in sleeves of a heat sink of the heat dissipating apparatus.
Figure 6:
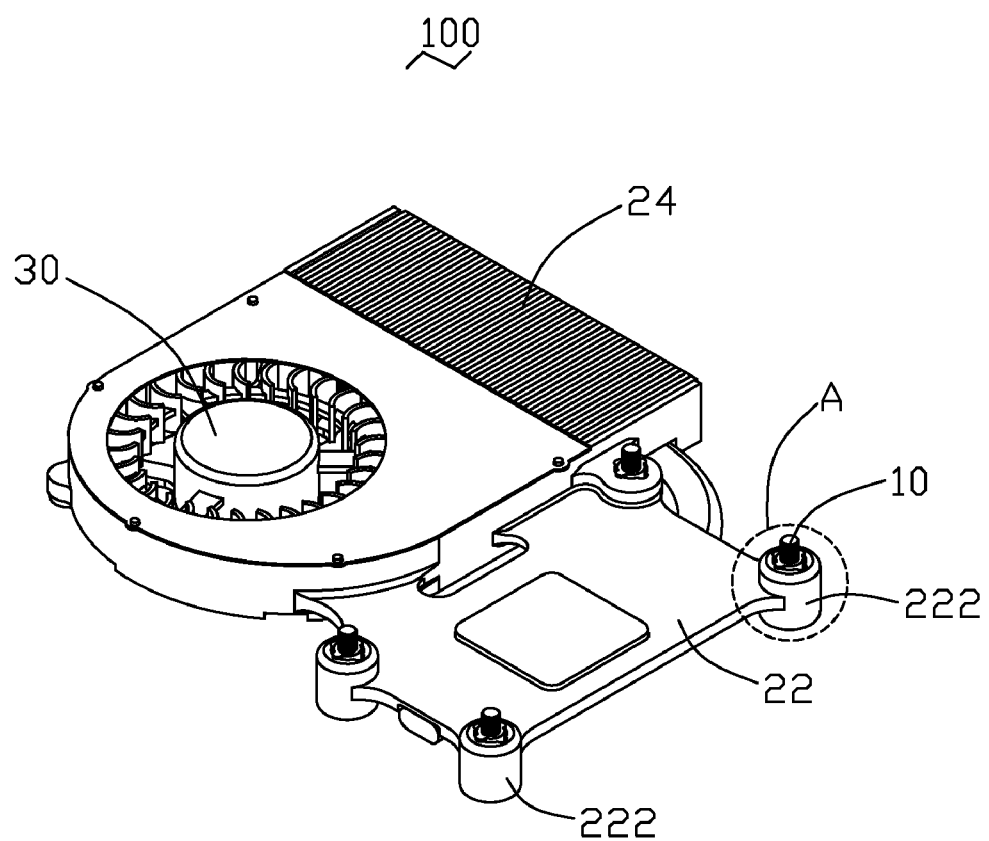
FIG. 6 is a view similar to FIG. 5, but showing the fastening elements being rotated to an assembled position of the heat dissipating apparatus.
Figure 7:
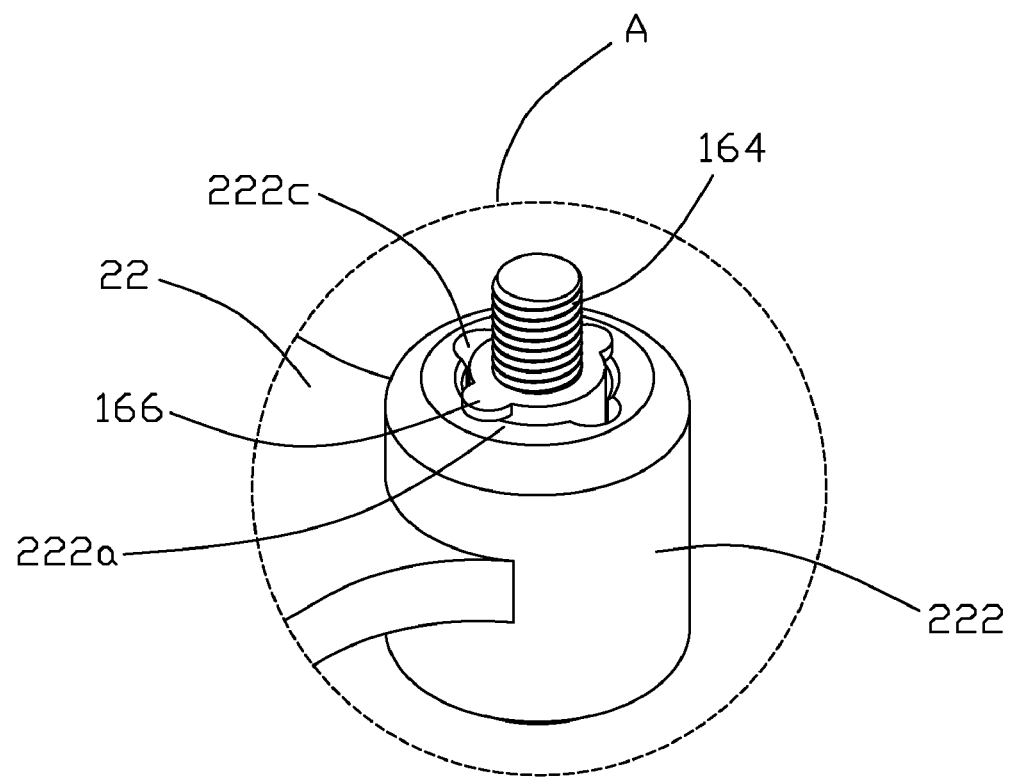
FIG. 7 is an enlarged view of a circled portion of FIG. 6 indicated by A.
Figure 8:
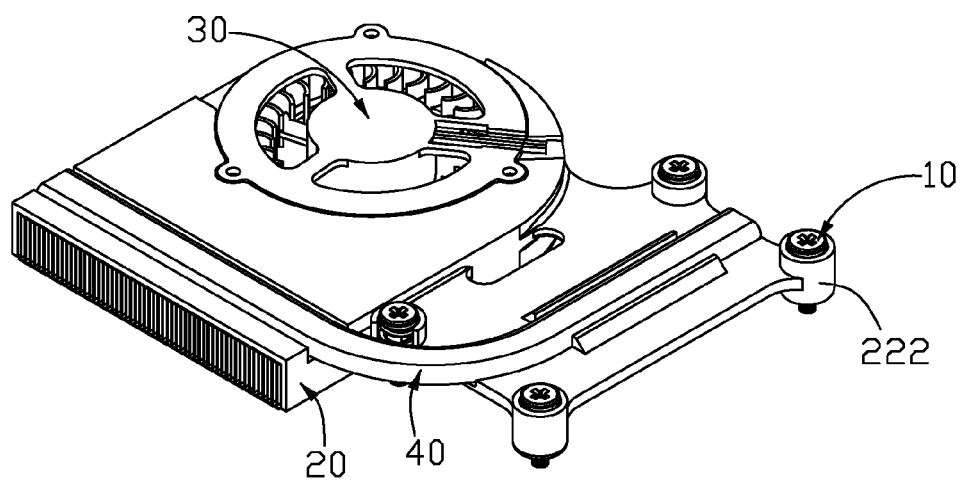
FIG. 8 is an assembled view of the heat dissipating apparatus of FIG. 1.

Referring to FIG. 4, each of the sleeves 222 includes a cylindrical hollow main body 222d, and a base plate 222a disposed at a bottom of and within the main body 222d. The base plate 222a defines a through hole 222b therein, and two opposite cutouts 222c besides and communicating with the through hole 222b. A diameter of the through hole 222b is substantially equal to a diameter of the main portion 162 of the connecting member 16. The cutouts 222c are semicircular-shaped in profile and have substantially similar configurations with the blocks 166 of the connecting member 16.

Referring to FIGS. 5 through 8, in assembly of the fastening elements 10 to the heat sink 20, the fastening elements 10 are disposed in the main bodies 222d of the sleeves 222, with the threaded ends 164 of the fastening elements 10 extending downwardly through the through holes 222b of the base plate 222a of the sleeves 222 and the blocks 166 of the fastening elements 10 aligning with the cutouts 222c of the sleeves 222. The heads 12 of the fastening elements 10 are pressed towards a bottom surface of the base 22 of the heat sink 20 until the blocks 166 of the fastening elements 10 extend downwardly through the cutouts 222c of the sleeves 222. The blocks 166 of the fastening elements 10 are then rotated for 90 degrees to predetermined positions which are oriented substantially perpendicular to a orientation of the cutouts 222c. The heads 12 of the fastening elements 10 are released so that the blocks 166 of the fastening elements 10 abut against the bottom surface of the base 22 of the heat sink 20. Therefore, the fastening elements 10 are securely assembled to the heat sink 20. Further, the assembly of the fastening elements 10 and the heat sink 20 are mounted on the circuit board with the threaded ends 164 of the fastening elements 10 extending through four through holes (not shown) defined in the circuit board. The threaded ends 164 of the fastening elements 10 are screwed in four mounting members such as screw nuts (not shown) to thereby mounting the assembly of the fastening elements 10 and the heat sink 20 to the circuit board, with the heat generating electronic component disposed on the circuit board intimately contacting with the base 22 of the heat sink 20.

In the prevent invention, the fastening elements 10 are fixed to the heat sink 20 via abutments between the blocks 166 and the bottom surface of the base 22 of the heat sink 20. The blocks 166 integrally extend from the main portions 162 of the connecting members 16 and have adequate strength, which prevents the blocks 166 from being deformed by an external force exerted thereon, and further prevents of the fastening elements 10 from separating from the heat sink 20 during transportation/handling of assembly of the heat sink 20 and the fastening elements 10. Moreover, since the blocks 166 are integrally formed with the connecting member 16 as a monolithic piece, falling of the blocks 166 on the circuit board to cause a short circuit of the circuit board is totally avoided.

Figure 9:
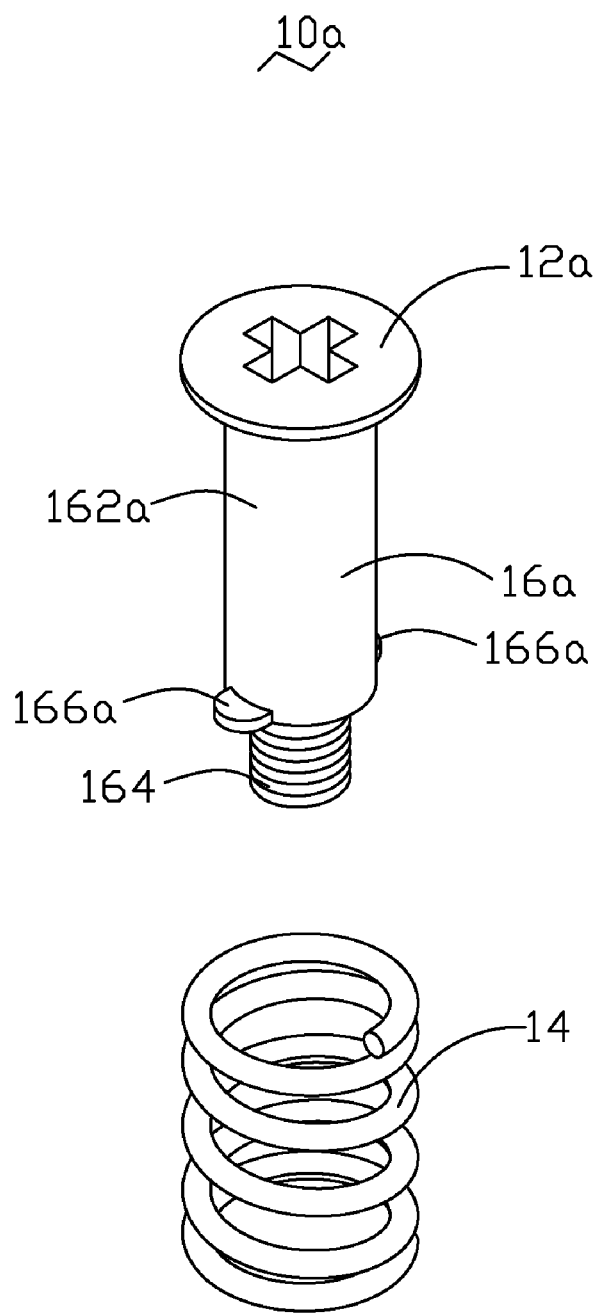
FIG. 9 is an exploded, isometric view of a fastening element of the heat dissipating apparatus according to a second embodiment of the present invention.
Figure 10:
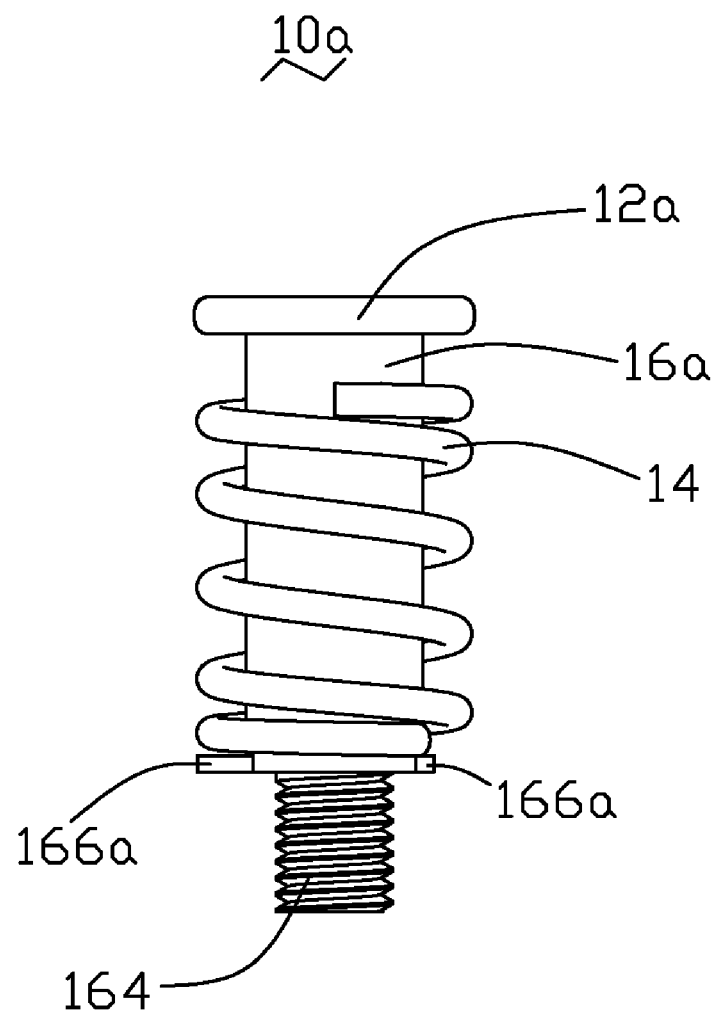
FIG. 10 is an assembled view of the fastening element of FIG. 9.

Referring to FIGS. 9 and 10, a second embodiment of the fastening elements 10a of the present heat dissipating apparatus 100 is shown. The difference between this embodiment from the previous preferred embodiment is: the head 12a is integrally formed with the connecting member 16a. A distance between the outer ends of the blocks 166a is substantially equal to a diameter of the inner side of the resilient member 14 so that the blocks 166a of the connecting member 16a can easily extend through the resilient member 14 to thereby dispose the resilient member 14 around the main portion 162a of the connecting member 16a. A length of a left one of the blocks 166a of the connecting member 16a is greater than a length of a right one of the blocks 166a, so that the left one of the blocks 166a can abut against the corresponding resilient member 14, thereby preventing the resilient member 14 from falling off from the connecting member 16a.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fastening element comprising:
    a head comprising a cap and two legs extending downwardly from the cap, each of the two legs forming a hook at a free end thereof;
    a connecting member connected with the head and comprising at least two blocks and a fixing portion below the at least two blocks, the connecting member, the at least two blocks and the fixing portion being integrally formed as a monolithic piece, a top end of the connecting member defining two opposite grooves therein and comprising two bulges in the two grooves, the connecting member defining an indent below each of the bulges; and
    a resilient member disposed around the connecting member and between the cap of the head and the at least two blocks of the connecting member, wherein the at least two blocks are used for engaging with a bottom face of a heat sink after the connecting member is extended downwardly through the heat sink and turned with a certain degree whereby the head, the connecting member and the resilient member are secured to the heat sink;

wherein the two legs of the head are respectively received in the two grooves of the connecting member, the hooks of the head are respectively received in the indents of the connecting member and engaged with the bulges of the connecting member, whereby the head is fixedly secured to the connecting member.

2. The fastening element as described in claim 1, wherein a distance between outer ends of the at least two blocks is greater than a diameter of an inner side of the resilient member, the at least two blocks having similar lengths.

3. The fastening element as described in claim 1, wherein the resilient member is disposed around the connecting member from a top end thereof.

4. The fastening element as described in claim 1, wherein the two bulges each have a slantwise surface for guiding the hooks to slip into the indents.

5. A heat dissipating apparatus comprising:

a heat sink comprising a base and a plurality of fins disposed at one side of the base; and a plurality of fastening elements each comprising a head, a resilient member and a connecting member, the head comprising a cap and two legs extending downwardly from the cap, each of the two legs forming a hook at a free end thereof, the connecting member comprising two blocks, the connecting member and the two blocks being integrally formed as a monolithic piece, a top end of the connecting member defining two opposite grooves therein and comprising two bulges in the two grooves, the connecting member defining an indent below each of the bulges, the resilient member being disposed around the connecting member and between the cap of the head and the two blocks of the connecting member, wherein the legs of the head are respectively received in the grooves of the connecting member, the hooks of the head are respectively received in the indents of the connecting member and engaged with the bulges of the connecting member, whereby the head is fixedly secured to the connecting member;

wherein the base defines a plurality of through holes therein for extension of the connecting members of the fastening elements and two cutouts in each through hole for extension of the two blocks, a portion of the connecting member and the blocks respectively extend through a corresponding through hole and the cutouts and are rotated to a certain position wherein the blocks abut against a bottom surface of the base of the heat sink so as to sandwich the resilient member between the cap of the head of the fastening element and the base of the heat sink, whereby the fastening elements are secured to the heat sink.

6. The heat dissipating apparatus as described in claim 5, wherein the base of the heat sink comprises a plurality of sleeves, the through holes are defined in bottom portions of the sleeves.

7. The heat dissipating apparatus as described in claim 5, wherein the connecting member further comprises two slantwise surfaces respectively formed on the two bulges for guiding the hooks to slip into the indents.

8. The heat dissipating apparatus as described in claim 5, wherein the resilient member is a coil spring which disposes around the connecting member, a distance between outer ends of the blocks being greater than a diameter of an inner side of the coil spring.

9. The heat dissipating apparatus as described in claim 5, wherein the head defines a crossed groove therein for receiving an external force which drives the fastening element to rotate to the certain position.

10. The heat dissipating apparatus as described in claim 5, further comprising a heat dissipating fan and a heat pipe disposed at a same side of the base of the heat sink, the fins of the heat sink being arranged at an air outlet of the heat dissipating fan.

\* \* \* \* \*

UNITED STATES PATENT AND TRADEMARK OFFICE
CERTIFICATE OF CORRECTION

PATENT NO. : 7,639,502 B2  Page 1 of 1
APPLICATION NO. : 11/614698
DATED : December 29, 2009
INVENTOR(S) : Hu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 266 days.

Signed and Sealed this

Ninth Day of November, 2010

David J. Kappos
*Director of the United States Patent and Trademark Office*